United States Patent [19]

Niioka et al.

[11] 4,392,246
[45] Jul. 5, 1983

[54] BROADCAST WAVE RECEIVING SYSTEM

[75] Inventors: Takeharu Niioka; Isao Kobayashi, both of Yokohama, Japan

[73] Assignee: Tokyo Shibaura Denki Kabushiki Kaisha, Kawasaki, Japan

[21] Appl. No.: 296,247

[22] Filed: Aug. 24, 1981

[30] Foreign Application Priority Data

Sep. 1, 1980 [JP] Japan .................................. 55-120952
Sep. 1, 1980 [JP] Japan .................................. 55-120955
Sep. 1, 1980 [JP] Japan .................................. 55-120956
Sep. 1, 1980 [JP] Japan .................................. 55-120957
Sep. 1, 1980 [JP] Japan .................................. 55-120958

[51] Int. Cl.³ .............................................. H04B 1/26
[52] U.S. Cl. .................................... 455/158; 455/184; 455/186
[58] Field of Search ............... 458/157, 158, 184, 186; 358/192.1

[56] References Cited

U.S. PATENT DOCUMENTS 3,940,702  2/1976  Yoshimura et al. ................. 455/186
4,122,395 10/1978  Schotz et al. ....................... 455/158

FOREIGN PATENT DOCUMENTS 2746186  4/1979  Fed. Rep. of Germany ...... 455/158
2813082  9/1979  Fed. Rep. of Germany ...... 455/158
2813727 10/1979  Fed. Rep. of Germany ...... 455/158
2903944  8/1980  Fed. Rep. of Germany ...... 455/158
53-3712   1/1978  Japan .................................. 455/158

Primary Examiner—Marc E. Bookbinder
Attorney, Agent, or Firm—Cushman, Darby & Cushman

[57] ABSTRACT

With the operation of character select keys, alphanumeric data stored in a ROM are successively read out and latched in a latch circuit under the control of a CPU. The call sign data of a received channel assembled in the latch circuit are stored together with the frequency data of that received channel in a RAM. The call sign data preset in this way is read out from the RAM by taking out the frequency data from the tuner and using it as address means and is visually displayed on a display unit while being informed of as voice by a voice synthesizer.

6 Claims, 6 Drawing Figures

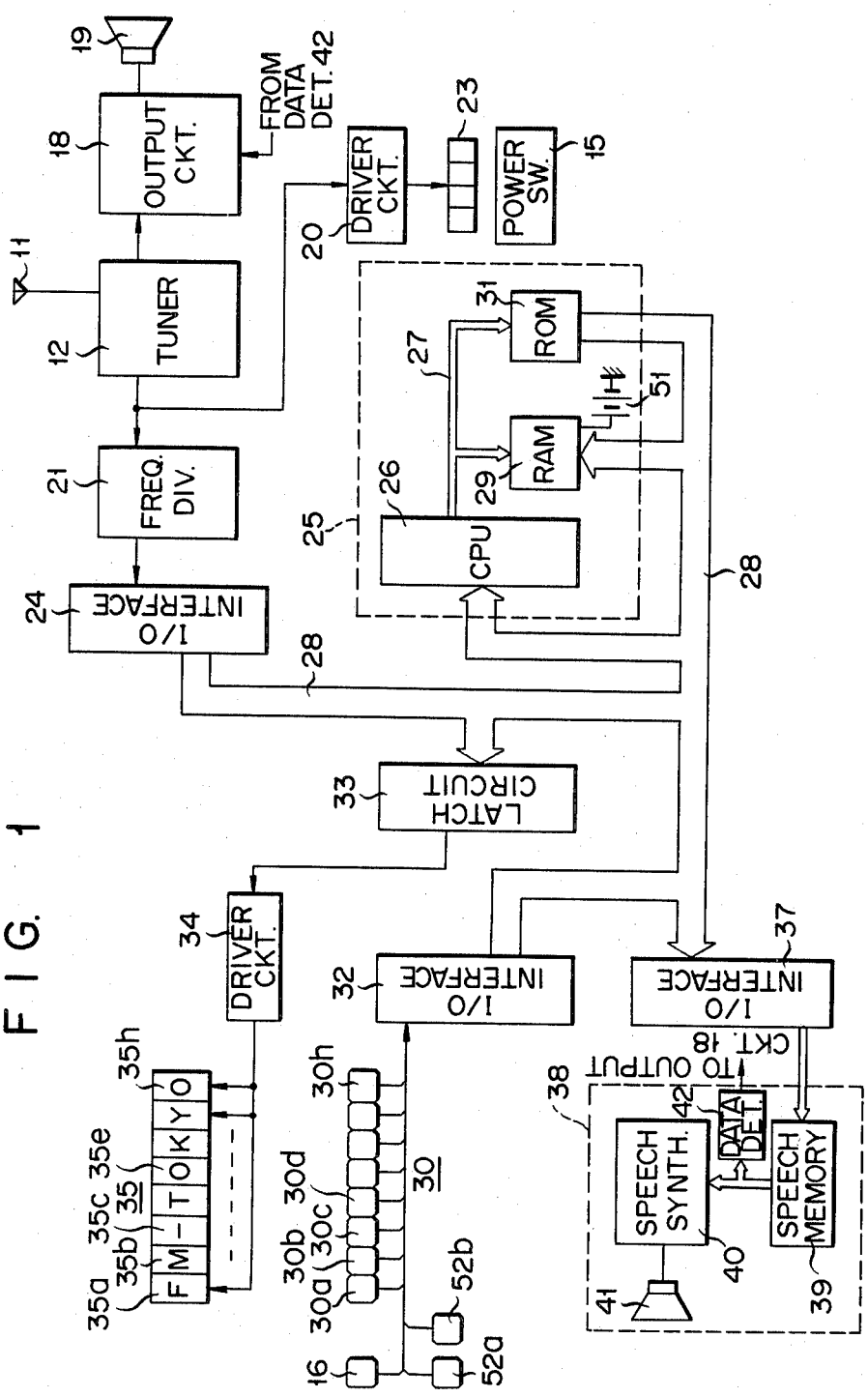
F I G. 1

BROADCAST WAVE RECEIVING SYSTEM

BACKGROUND OF THE INVENTION

This invention relates to a broadcast wave receiving system provided with a received channel informing device, in which the names or so-called call signs of broadcast channels capable of reception are preset and which informs the user, at the time of reception of a channel, the name or call sign of that channel.

Stereophonic broadcast wave receiving systems include one using a received broadcast channel indicating system, in which names of all the broadcast channels capable of reception are preliminarily stored and which informs the user of the name of a received channel detected from the frequency being received.

The channel names (call signs) are represented by alphanumeric data, and these data are preset in a read only memory (ROM) having a capacity corresponding to the number of broadcast channels capable of reception. At the time of the presetting, only the call signs of the broadcast channel capable of reception in a region where the receiving set is installed are read out from the ROM and written into a random access memory (RAM) for the edition. At the time of broadcast receiving, call sign data is read out of the RAM and displayed on a display unit.

In this system, the call sign data for all the broadcast channels have to be stored in the ROM, and to this end a ROM having a large capacity is inevitably necessary. When the capacity of ROM is reduced, the number of broadcast channels capable of presetting is restricted to limit the applicable area of the broadcast wave receiving system.

SUMMARY OF THE INVENTION

An object of the invention is to provide a broadcast wave receiving system provided with a received channel informing device, which is inexpensive, simple in construction and is capable of ready and reliable presetting in a short period of time.

According to the invention, the above object is attained by a broadcast wave receiving system comprising means for generating a plurality of alphanumeric data, means for specifying a received channel call sign presetting mode, means for producing desired call sign data by successively taking out a plurality of alphanumeric data from the generating means, call sign data storage means for successively storing call sign data from the call sign data producing means and received broadcast wave frequency data corresponding to the call signs in combination, means for comparing the received broadcast wave frequencies obtained from a tuner device of the receiving system and frequency data stored in the call sign storage means at the time of the receiving mode, and means for reading out a call sign data from the call sign data storage means in response to a corresponding output of the comparing means and informing the user of it.

BRIEF DESCRIPTION OF THE DRAWINGS

FIG. 1 is a block diagram showing an embodiment of the broadcast wave receiving system provided with received channel informing means according to the invention;

DETAILED DESCRIPTION OF THE PREFERRED EMBODIMENT

Figure 2:
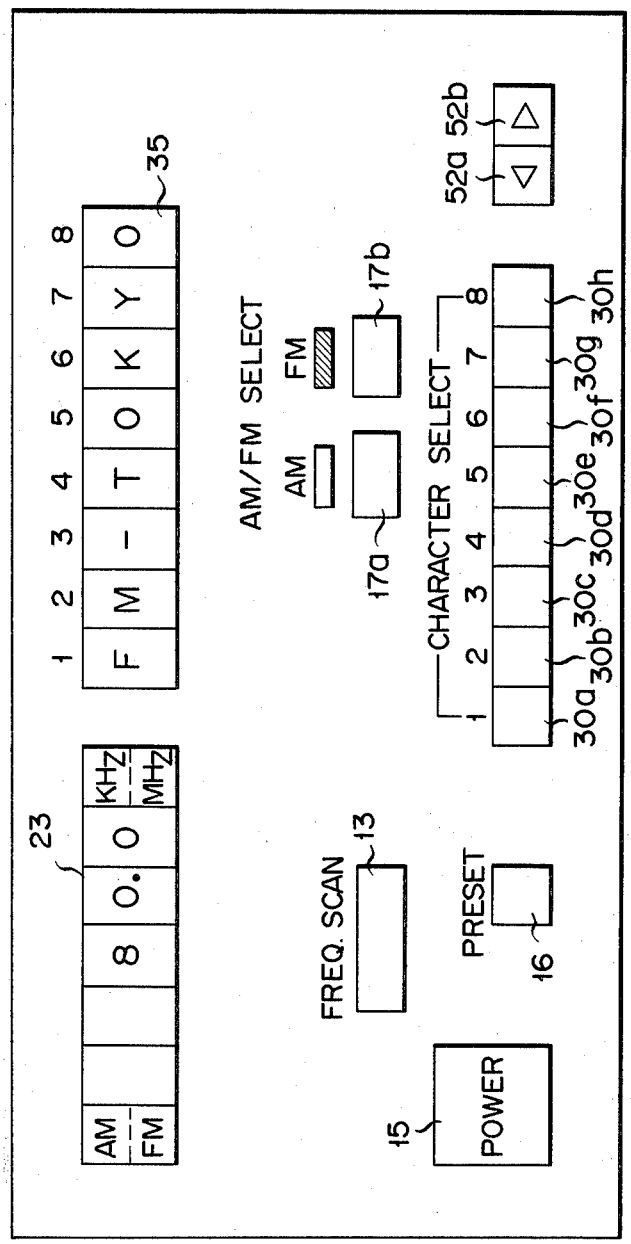
FIG. 2 is a view showing an operating panel of an AM/FM receiver incorporating the received channel informing means shown in FIG. 1.

Referring now to FIG. 1, an AM/FM broadcast high frequency signal intercepted by an antenna 11 is coupled to a tuner 12 of an AM/FM receiver. In this embodiment, a synthesizer tuner is used as the tuner 12. For instance, it is assumed that an FM broadcast wave of 80.0 MHz is referred to by a call sign "FM-TOKYO". When the power switch 15 is turned ON and AM/FM select button 17b is depressed, with the operation of a frequency scan button 13 on the panel shown in FIG. 2, the synthesizer 12 is tuned to a frequency of 80.0 MHz.

The tuned broadcast signal from the synthesizer tuner 12 is detected and amplified by an output circuit 18 of the receiver, and the FM program is reproduced from the loudspeaker 19. The frequency tuned broadcast signal of the synthesizer 12 is also coupled to a display drive circuit 20 and a frequency reader 21. The display drive circuit 20 detects the frequency of the tuned broadcast signal and forms decimal frequency data. This frequency data is supplied to a display unit 23, whereby the received signal frequency of 80.0 MHz is displayed.

The frequency reader 21 is constituted by a frequency divider with the frequency division ratio set to, for instance, one-hundredth. The frequency division ratio should be set at an extent that a data processing section 25 can follow the divided frequency. The output of the frequency divider 21 is supplied to an I/O interface 24 for conversion into binary frequency data. This frequency data is supplied through a data bus 28 to an address location of a random access memory (RAM) 29 that is specified by an address signal supplied from a CPU 26 in the data processing section 25 via an address bus 27. The data processing section 25 includes a read only memory (ROM) 31, the addresses of which are specified from the CPU 26 via an address bus 27. In the ROM 31, character data representing, for instance, alphabet letters A to Z and data representing a hyphen (—) are stored. In the ROM 31, system programs for the instruction execution of operation of the CPU 26 and monitor programs for monitoring the tasks of the data processing section 25 are accommodated.

A call sign "FM-TOKYO" of the broadcast channel is intended to preset in this state, a first character select key 30a in a character select key group 30 is depressed. As a result, the keyed-in data is provided with a flag. This flag has an effect of resetting a memory location for storing a set of call signs in the RAM 29 to be described later and rendering the CPU 26 ready to accept an interruption.

With the depression of the first character select key 30a, the key operation signal produced as a result is converted in an I/O interface 32 into a binary keyed-in signal, which is coupled through the bus 28 to the CPU 26. When it receives the keyed-in signal, the CPU 26 supplies an address signal through an address bus 27 to a ROM 31, and according to the address signal character data for alphabet letters A to Z are successively read out from the ROM 31. The character data thus read out are supplied through the data bus 28 to a latch circuit 33 and thence to a driver circuit 34. The driver circuit 34 serves to drive display elements 35a and 35h in a call sign display unit 35. While the character select key 30a is being depressed, alphabet data for the letters A to Z are repeatedly read out from the ROM 31, and the content of the latch circuit 33 and the display content of the display element 35a are thus successively changed. The character select key 30a is held depressed until the letter F is displayed on the display element 35a, whereupon it is released by the user. As a result, a data latch signal is delivered from CPU 26 to latch circuit 33 via data bus 28 and the alphabet data of "F" is latched in the first digit position of the latch circuit 33, and the display of F on the display element 35a is held.

The character data "F", "M", "-", "T", "O", "K", "Y" and "O" may be latched in the first to eighth digits of the latch circuit 33 for the display of the data "FM-TOKYO" by operating the character select keys 30a to 30h in the manner as described above.

In this state of display, by depressing the preset key 16 a preset signal is supplied through the interface I/O 32 to the CPU 26. When the CPU 26 receives the preset signal, the CPU 26 specifies the address of the first memory location of the RAM 29 via the address bus 27. At the same time, it specifies the first digit of the latch circuit 33 to let the character data for "F" be transferred from the latch circuit 33 to the first memory location of the RAM 29.

Figure 3:
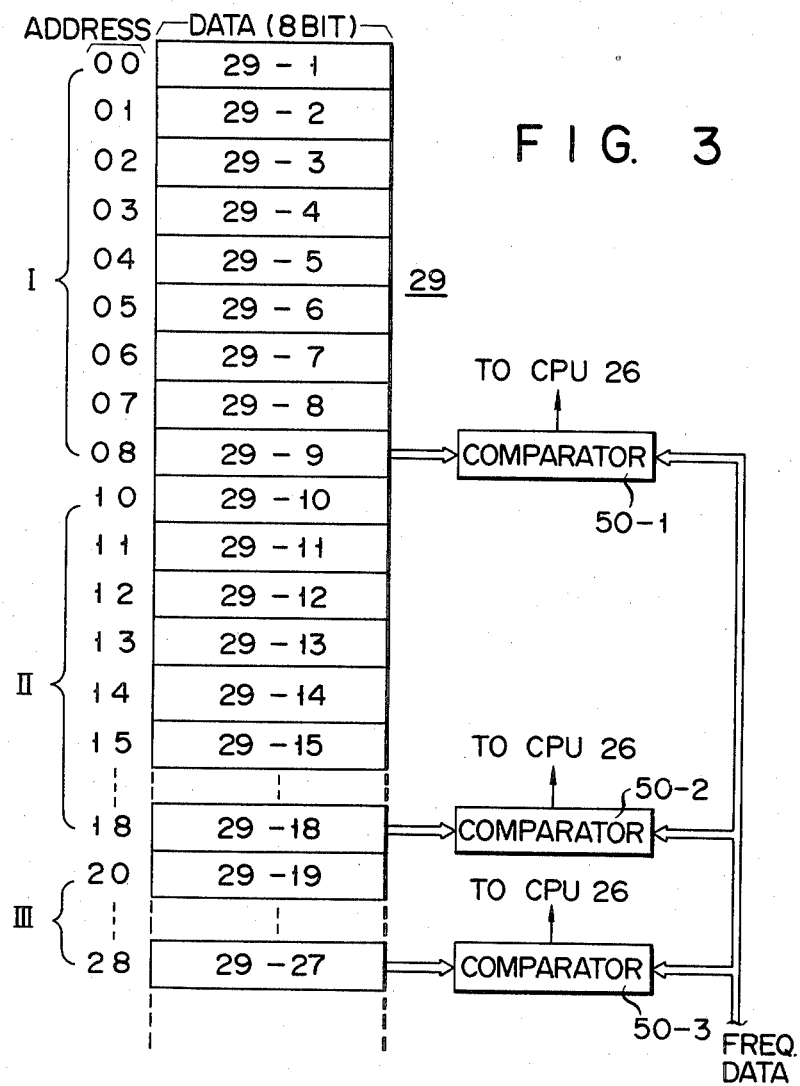
FIG. 3 is a block diagram showing a specific construction of part of the RAM shown in FIG. 1.

FIG. 3 shows the construction of the RAM 29. The RAM 29 has a plurality of memory locations 29-1, 29-2, ... each having, for instance, an 8-bit construction. The memory locations 29-1 to 29-9 respectively have memory addresses 00 to 08 and constitute a first memory group I. The memory locations 29-10 to 29-18 respectively have memory addresses 10 to 18 and constitute a second memory group II. The memory locations 29-19 to 29-27 respectively have memory addresses 20 to 28 and constitute a third memory group III. The memory group I has a capacity of storing data of a call sign consisting of 8 letters at the most, and the memory groups II and III are provided for storing other call sign data. The number of memory groups may be selected according to the number of call signs desired to be preset.

When the preset key 16 is depressed in the state with the character data of "F", "M", "-", "T", "O", "K", "Y" and "O" latched in the latch circuit 33, the CPU 26 first generates an address signal "00" to specify the first memory location 29-1 so as to let the character data of "F" in the first digit of the latch circuit 33 to be written into the first memory location 29-1 via the data bus 28. The character data for each alphabet letter has an 8-bit configuration, and thus each of the memory locations 29-1 to 29-27 may be of an 8-bit construction.

When the writing of the character data "F" in the first memory location 29-1 is ended, the CPU 26 specifies the next address "01" to let the character data "M" in the second digit of the latch circuit 33 be written into the memory location 29-2. In this way, the character data "FM-TOKYO" are successively written in the memory locations 29-1 to 29-8. When the last character data "O" is written in the eighth memory location 29-8, the received frequency data supplied from the I/O interface 24 to the data bus 28 is written in the ninth memory location 29-9 under the control of the CPU 26.

When the writing of the data of the call sign "FM-TOKYO" in the memory group I is ended, the CPU 26 detects this and successively reads out the call sign data stored in the memory group I for supplying them through the data bus 28 to the I/O interface 37. The I/O interface 37 has a function of an address decoder and supplies an address signal corresponding to the character data for letters A to Z supplied from the RAM 29 to a speech memory 39 in a voice synthesizer 38. In the speech memory 39, voice signal data (or voice elements) representing, for instance, man's utterance of alphabet letters A to Z and hyphen -.

Thus, when the data for the call sign "FM-TOKYO" is read out from the RAM 29 and supplied to the I/O interface 37, the alphabet and hyphen voice signal data for the letters F, M, -, T, O, K, Y and O are successively read out from the speech memory 39 and supplied to a speech synthesizer 40. In the speech synthesizer 40, the man's voice signals for F, M, -, T, O, K, Y and O are synthesized, and the call sign "FM-TOKYO" is pronounced from the loudspeaker 41. As the voice synthesizer, various devices recently developed and marketed can be used. The fact that the call sign "FM-TOKYO" is correctly preset can be confirmed from the pronounciation of this call sign.

After the presetting of a call sign has been completed in the above way, the next preset routine can be made. For example, a channel "NHKFM" at 82.5 MHz is tuned at the tuner 12 by depressing the frequency scan button 13. In this state, as in the aforementioned case, five character data for "NHKFM" are caused to be read out from the ROM 31 and latched in the latch circuit 32 by successively depressing the character select keys 30a, 30b, .... Then, by depressing the preset key 16, the character data of "NHKFM" are written from the first memory location 29-10 in the memory group II into the fifth memory location 29-14. Subsequently, the received frequency data obtained through the division of the frequency 82.5 MHz is supplied from the I/O interface 24 to the ninth memory location 29-18 and stored therein.

Similarly, the call sign data are successively stored in the memory group III and following memory groups in the RAM 29.

When receiving a desired channel after the presetting of all the given stations is completed, the configuration of the call sign of the received channel is done in the following way.

When the frequency scan button 13 is operated, the synthesizer 12 is tuned to "FM-TOKYO" at 80.0 MHz, and the received frequency data is coupled through the frequency divider 21 and I/O interface 24 to one input terminal of each of comparators 50-1, 50-2, ... which are accessory to the RAM 29 shown in FIG. 3. To the other input terminals of the comparators 50-1, 50-2, ... are always supplied the frequency data of individual channels that are stored in relation to the individual call sign data in the memory locations 29-9, 29-18, 29-27, .. . When two frequency data inputs to a comparator coincide, a coincidence signal therefrom is supplied to the CPU 26. As a result, the CPU 26 executes the reading of call sign data stored in the memory group of the RAM 29 that is associated by the comparator providing the coincidence signal. In the instant case, the received frequency data supplied to one input terminal of each of the comparators 50-1, 50-2, . . . represents the frequency of 80.0 MHz. Thus, the coincidence output is obtained from the comparator 50-1 in FIG. 3, and the data of the call sign "FM-TOKYO" stored in the first memory group I is supplied to the latch circuit 33 and I/O interface 37. As a result, the man's voice utterance of "FM-TOKYO" is produced from the loudspeaker 41 of the voice synthesizer 38. Meanwhile, the character data for the "FM-TOKYO" supplied to the latch circuit 33 is sent forth to the display drive circuit 34 for the display of the call sign "FM-TOKYO" on the display unit 35. In this way, the user can know the fact that it is ready to receive the FM broadcast of a desired channel from the voice utterance production and character display of the call sign "FM-TOKYO". To the RAM 29 a battery 51 is connected as a separate power supply to ensure that the call sign data preset in the RAM 29 will be preserved even when the power source for the system is turned off by the power switch 15.

In the above description, when the synthesized signal is supplied from the speech synthesizer 40 in the voice synthesizer 38 to the loudspeaker 41, the tuner 12 has already been tuned to the channel at 80.0 MHz, and the FM broadcast program is being reproduced from the output circuit 18 through the loudspeaker 19. Therefore, it is likely that the synthesized voice reproduction from the loudspeaker 41 cannot be heard due to sound, for instance music, reproduced from the loudspeaker 19. Accordingly, the output data supplied from the speech memory 39 may also be supplied as a muting signal to the output circuit 18 through a data detector 42. By so doing, the volume of sound produced from the loudspeaker 19 is reduced only when the synthesized voice is produced from the loudspeaker 41. A certain period of time is required until sound is produced from the loudspeaker 19 after the instant when the tuner 12 is tuned to a broadcast frequency. The aforementioned muting circuit is not needed for a receiver where the time interval until the production of the broadcast sound is long enough to assure that the synthesized voice is produced from the loudspeaker 41 before the reproduction of the broadcast sound from the loudspeaker 19.

In the embodiment of FIG. 1, in which a synthesizer tuner is used as the tuner 12, it may be thought that no tuning error is received frequency occurs. However, with the tuner using an ordinary tuning dial more or less tuning error is inevitable. If there is a tuning error, no coincidence output can be provided from the comparators 50-1, 50-2, . . . accessory to the RAM 29 in FIG. 3. To cope with such a problem, it may be thought to round off, for instance, the fraction of ±100 kHz in the FM broadcasting frequency compared in the comparators 50-1, 50-2, . . . . For example, when the received frequency in the channel of 80.0 MHz is in the range of 79.9–80.1 MHz, the fraction of 0.1 MHz may be rounded off to obtain 80.0 MHz which may be dealt with.

As an another method, tuning error data of ±100 kHz may be preliminarily stored in the ROM 31, at the time of the presetting of the result of synthesis of the received frequency data from the I/O interface 24 and the tuning error data may be stored in the RAM 29, and at the time of tuning the synthesized frequency data may be supplied to one input terminal of each of the comparators 50-1, 50-2, . . . .

In the ROM 31 may be stored not only the data for the alphabet letter A to Z and hyphen but also the numeral data for 0 to 9 if they are required for assembling the call sign.

In this case, it is necessary to preliminarily store only the alphabet letter data A to Z and numeral data 0 to 9 and, if necessary, tuning frequency error data in the ROM 31, and thus it is possible to reduce the number of ROMs employed or reduce the storage capacity of ROM. Thus, a simple and inexpensive receiving system can be obtained.

Further, at the time of presetting the call sign, the user can operate the character select keys 30 while confirming each character of the call sign, and at the end of presetting the preset call sign is informed of by voice production from the voice synthesizer 38. Thus, the call sign can be preset readily and accurately.

When one of the character select keys 30a to 30h is depressed at the time of presetting, successive characters A to Z and 0 to 9 are displayed one after another on the corresponding one of the unit display elements 35a to 35h in the display unit 35. The speed of the display, i.e., the time required for completing the display of all the characters once, is determined by the frequency of the clock signal which determines the operation speed of the CPU 26. While the display speed is desirably as fast as possible from the standpoint of the reproduction of the call sign presetting time, if the speed is too fast, it is difficult to release the character select key 30 while the coincidence of the displayed character and given character, is in force.

Accordingly, in the embodiment of FIG. 1 a forward feed key 52a and a reverse feed key 52b, if necessary, are provided in relation to the character select keys 30. In this connection, a reversible counter is provided in, for instance, the I/0 interface 32 in FIG. 1. When the forward or reverse feed key 52a or 52b is operated, the read-out clock for reading out the alphanumeric data from the ROM 31 is switched by the output of the reversible counter. The output value of the reversible counter is incremented by one every time the forward feed key 52a is operated and decremented every time the reverse feed key 52b is operated.

For instance, when reading out the alphabet data F from the ROM 31 by operating the character select key 35a at the time of the presetting, the operation of reading out consecutive characters by the character select key 35a is stopped as soon as the letter C, three characters before F, appears, and then the forward feed key 52a is operated three times, thereby reading out the given character F. If the reading operation happens to go beyond F up to H, the reverse feed key 52b may be operated twice for reading out the given character F. In this way, reduction of the presetting time can be obtained.

While in the above case both the forward and reverse character-by-character feed functions are provided, it is possible to provide only the forward character-by-character feed function. In this case, the automatic reading by the operation of character select key may always be stopped before the appearance of the given character, and then the forward key may be operated. As a further alternative method, the character select keys may each be provided with two distinct functions, namely that of automatic reading which is provided in the first operation and that of manual reading provided in the second operation.

Further, instead of using the manual character-by-character feed keys as described above, the speed of reading out the character data from the ROM may be adopted to be changed to a lower speed in the neighborhood of the given character. This also permits the reduction of read-out time.

Figure 4:
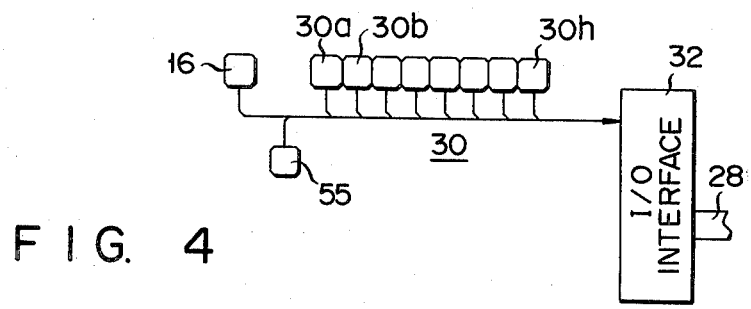
FIG. 4 is a view showing the construction of a key input device in a different embodiment of the invention.

FIG. 4 shows an example of the keying section which is based upon the concept described above. Here, a read-out speed reduction key 55 is provided. For example, when reading out, for instance, the alphabet data for F by operating the character select key 30, the speed reduction key 55 is operated while the alphabet data of, for instance, D is in force. The operation signal of the key 55 is supplied through the interface 32 to the CPU 26 in FIG. 1 to let the CPU 26 effect such a control as to reduce the read-out clock frequency by varying the frequency division ratio of a counter provided in the CPU 26 for determining the frequency of the read-out clock for reading out the character data from the ROM 31.

With this construction, with which the character display speed in reduced when a character in the neighborhood of a given character is displayed on the display unit 35, enough time is provided for releasing the character select key 30 by confirming the coincidence of the displayed character and given character. Thus, ready and reliable presetting of the call signs can be obtained. Nevertheless, since the character display speed is fast before the operation of the speed reduction key 55, it is possible to quickly read out a given character data and reduce the call sign presetting time.

Further, instead of separately providing the speed reduction key 55, its function may be provided on the character select keys 30a to 30h. For example, the character select keys 30a to 30h may be constructed to provide a three-step function, starting the character display with the first operation, commencing reduced-speed character display with the second operation and locking the character display with the third operation. The outputs of the character select keys 30a to 30h may be appropriately coupled to the CPU 26 to obtain this control thereby.

While in the above embodiment the information displayed on the display panel has all concerned with the received channel program contents such as the received frequency, call sign, distinguishment between AM and FM, channel number, etc., it is also possible to further provide another information by means of display or voice production. When the receiving system is provided on an automobile, information such as overheat, fuel empty, and door unlocked may be displayed or announced.

Figure 5:
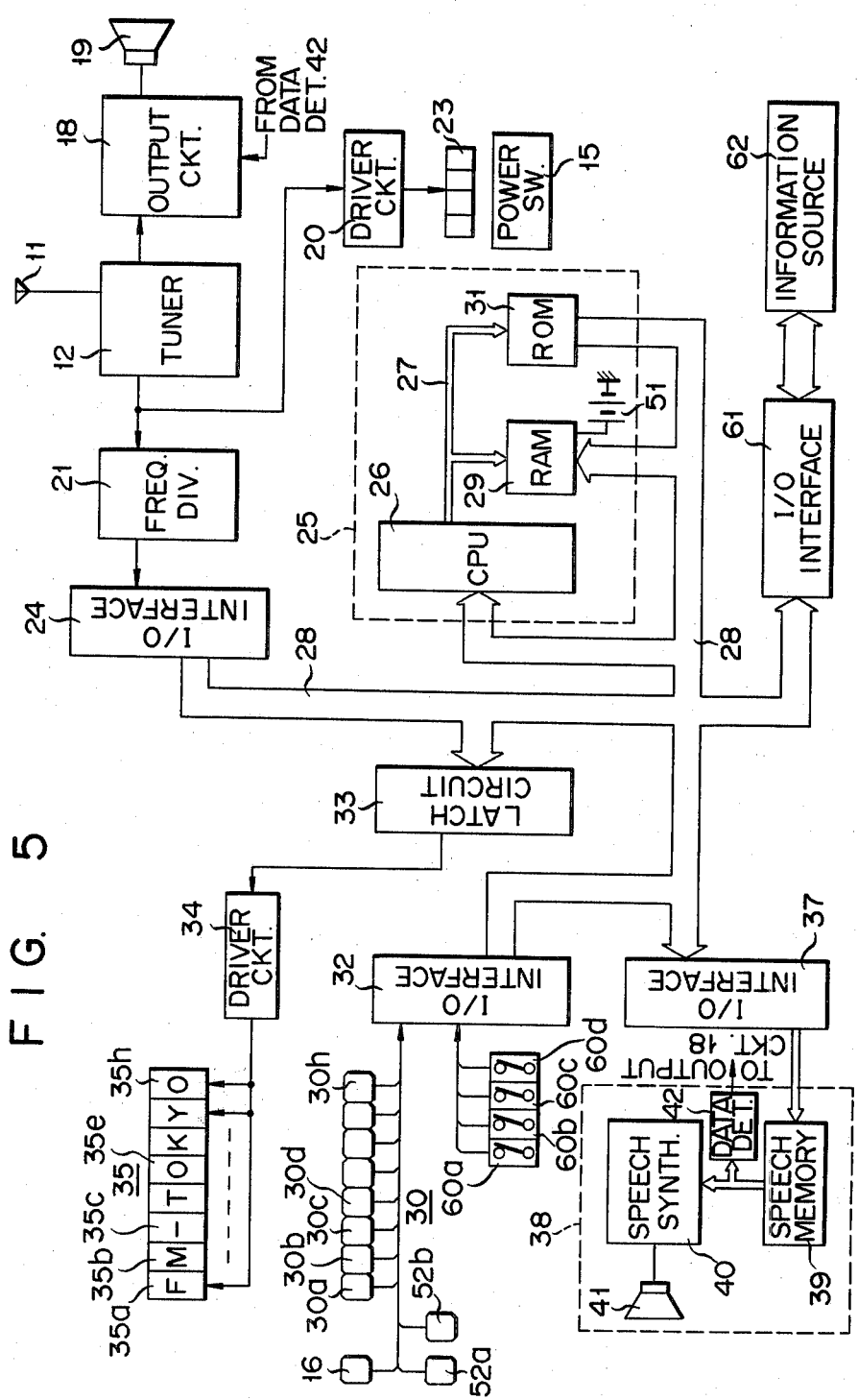
FIG. 5 is a block diagram showing a further embodiment of the invention.

FIG. 5 shows a further embodiment which is based upon the above concept. Parts corresponding to those in the preceding embodiment of FIG. 1 are designated by like reference numerals, and their detailed description is omitted. Referring to FIG. 5, four information confirmation keys 60a, 60b, 60c and 60d are provided in the keying section and connected to the I/O interface 32. The keyed-in signals from these keys are supplied through the I/O interface 32 and bus 28 to the CPU 26. The information confirmation keys 60a to 60d are thermostats provided on an engine for triggering such information as overheat, fuel empty or door unlocked. When one of these keys 60a to 60d is turned on, the output obtained is supplied to the CPU 26 via I/O interface 32. Data required to display or announce information is read out of ROM 31 by the operation of CPU 26. The read-out data is transferred through I/O interface 37 and latch circuit 33 to the speech memory 39 and driver circuit 34 to obtain the corresponding announce and display.

While in the preceding embodiments the character data stored in the ROM 31 are read out by operating the character select keys 30a to 30h or by operating information confirmation key, it is also possible to construct the keying section such that it has alphabet keys for alphabet letters A to Z and that by operating, for instance, the key for the letter A the character data for "A" is obtained from it.

Figure 6:
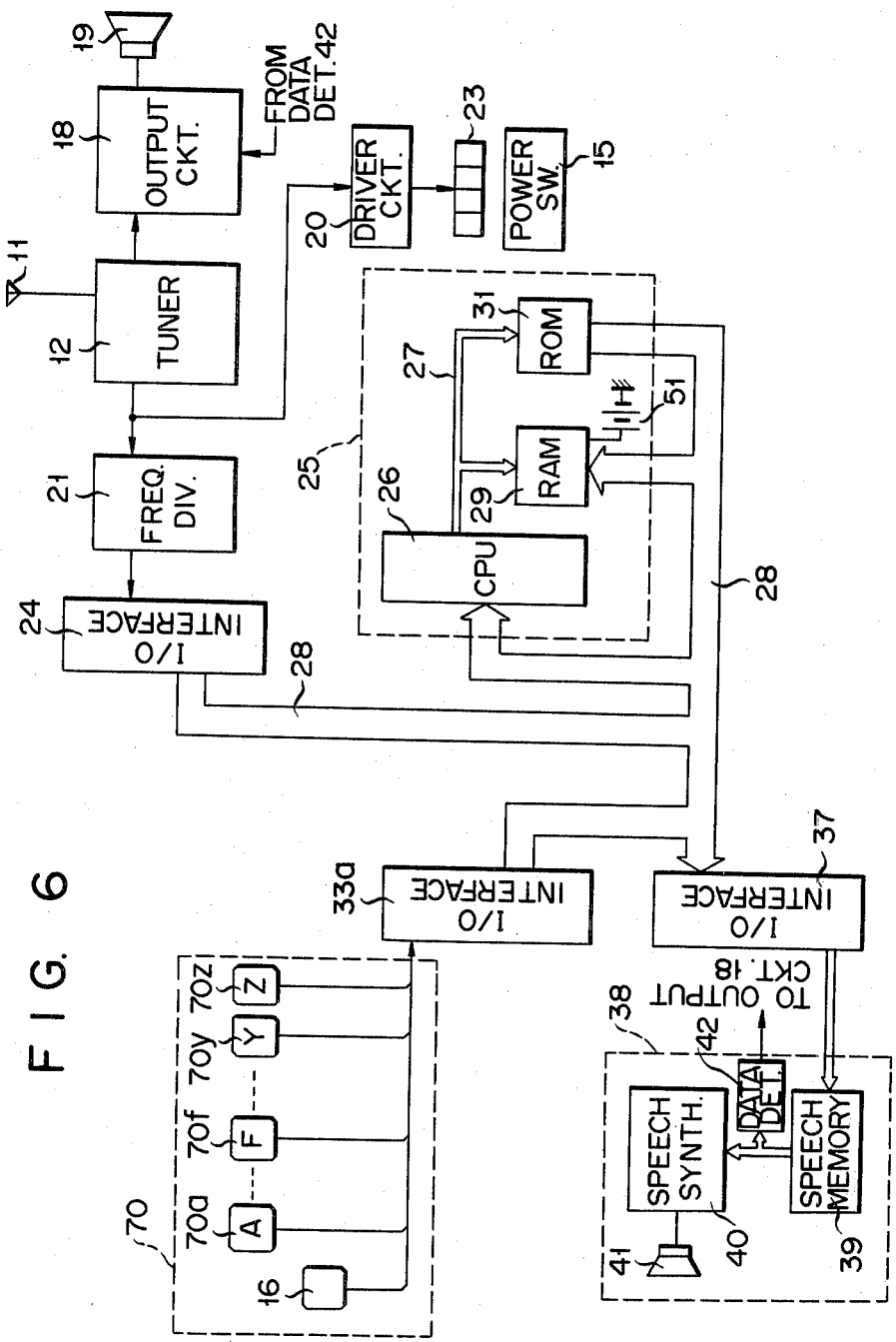
FIG. 6 is a block diagram showing a still further embodiment of the invention.

FIG. 6 shows a further embodiment, which is based upon the above concept. Parts corresponding to those in the preceding embodiments are designated by like reference numerals, and their detailed description is omitted. Referring to FIG. 6, a keying section 70 includes 26 character keys 70a to 70z for the respective alphabet letters A to Z and a preset key 16.

Now, the case when presetting, for instance, a call sign "FM-TOKYO". First, the tuner 12 is tuned to 80.0 MHz, and the FM broadcast of this channel is reproduced from the loudspeaker 19 connected to the output circuit 18. The tuned frequency signal at 80.0 MHz is converted by the frequency divider 21 into the received frequency data, which is supplied through the I/O interface 24 and bus 28 to the RAM 29. In this state, by operating the character key 70f the character data for "F" is formed in the keying section 70 and is latched in the first digit location of the I/0 interface or latch circuit 33a. In this embodiment, no display unit is necessary because the character keys for coupling the character data are operated. When successive character keys are operated to couple the character data "FM-TOKYO", the call sign data for "FM-TOKYO" are all latched in the latch circuit 33a.

When the preset key 16 is released here, the CPU 26 causes the call sign data "FM-TOKYO" from the latch circuit 33a and the received frequency data of 80.0 MHz to be stored together in the first memory group of the RAM 29. At the same time, the voice pronouncing "FM-TOKYO" is produced from the loudspeaker 41 of the voice synthesizer 38. Thus, the accurate presetting of the channel can be confirmed.

In the above embodiment, of FIG. 6, in which the character data are formed within the keying section 70, there is no need of storing character data in the ROM 31. If numeral data of 0 to 9 are also required for the formation of call signs, ten numeral data keys may also be provided in the keying section 70, or numeral data may be stored in the ROM 31 and numeral select keys (not shown) may be provided in the keying section 70 for reading out numeral data.

As has been described in the foregoing, according to the invention it is possible to provide a broadcast receiving system provided with a received channel informing system, which can be inexpensively manufactured and permits the presetting of a call sign readily reliably and in a reduced period of time.

What we claim is:

1. A broadcast wave receiving system comprising:
    a tuner device;
    means for storing a plurality of alphanumeric characters;
    means for sequentially reading said characters from said storing means;
    means for specifying a received channel call sign presetting mode;

means for producing a desired call sign data by successively selecting desired ones of said characters read out by said reading means;

call sign data storage means for successively storing call sign data from said call sign data producing means and received broadcast wave frequency data corresponding to said call sign data when said presetting mode is specified;

means for comparing data corresponding to received broadcast wave frequencies obtained from said tuner device and frequency data stored in said call sign storage means at a time of reception after said successive data storing;

means for reading out a call sign data from said call sign data storage means in response to a frequency data coincidence output of the comparing means; and means for informing the user of said call sign data.

2. A broadcast wave receiving system comprising:
a tuner device;
a plurality of character select keys;
a read only memory in which a plurality of alphanumeric data are stored;
means for reading a given alphanumeric data from said read only memory according to the operation of said character select keys;
a key for reducing the speed of reading out data from said read only memory;
means for specifying a received channel call sign presetting mode;
means for producing a desired call sign data by successively taking out a plurality of alphanumeric data from said reading means;
call sign data storage means for successively storing call sign data from said call sign data producing means and received broadcast wave frequency data corresponding to said call sign data when said presetting mode is specified;

means for comparing data corresponding to received broadcast wave frequencies obtained from said tuner device and frequency data stored in said call sign storage means at a time of reception after said successive data storing;

means for reading out a call sign data from said call sign data storage means in response to a frequency data coincidence output of the comparing means; and means for informing the user of said call sign data.

3. The broadcast wave receiving system according to claim 1 or 2 wherein said means for informing the user of call sign data includes call sign data display means and means for synthesizing voice corresponding to displayed call sign data.

4. The broadcast wave receiving system according to claim 3, wherein said call sign data storage means further stores tuning error data in combination with the received frequency data.

5. The broadcast wave receiving system according to claim 2 further comprising forward and reverse feed keys for respectively forwardly and reversely reading out the alphanumeric data from said read only memory for one character after another.

6. The broadcast wave receiving system according to claim 1, which further includes means for generating confirmation data about time, temperature, etc. other than the received broadcast program contents, and at least one data confirming key for causing said informing means to inform of the confirmed data.

* * * * *